US012648310B2

(12) United States Patent
Zhao et al.

(10) Patent No.: US 12,648,310 B2
(45) Date of Patent: Jun. 2, 2026

(54) ORGANIC LIGHT-EMITTING DISPLAY SUBSTRATE AND DISPLAY DEVICE

(71) Applicant: BOE TECHNOLOGY GROUP CO., LTD., Beijing (CN)

(72) Inventors: Dejiang Zhao, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 453 days.

(21) Appl. No.: 17/595,644

(22) PCT Filed: Dec. 23, 2020

(86) PCT No.: PCT/CN2020/138592
§ 371 (c)(1),
(2) Date: Nov. 19, 2021

(87) PCT Pub. No.: WO2022/133795
PCT Pub. Date: Jun. 30, 2022

(65) Prior Publication Data
US 2022/0399528 A1 Dec. 15, 2022

(51) Int. Cl.
*G02B 30/26* (2020.01)
*H10K 59/124* (2023.01)
(Continued)

(52) U.S. Cl.
CPC ........... *H10K 59/124* (2023.02); *G02B 30/26* (2020.01); *H10K 59/353* (2023.02);
(Continued)

(58) Field of Classification Search
CPC ............. H10K 50/856; H10K 59/8791; H10K 59/124; H10K 59/878; H10K 59/00;
(Continued)

(56) References Cited

U.S. PATENT DOCUMENTS

2005/0057460 A1 3/2005 Lee et al.
2007/0075305 A1 4/2007 Miyata et al.
(Continued)

FOREIGN PATENT DOCUMENTS

CN 1592518 A 3/2005
CN 1941404 A 4/2007
(Continued)

OTHER PUBLICATIONS

United States Patent and Trademark Office, Non-Final Office Action Issued in U.S. Appl. No. 17/754,225, filed Apr. 24, 2024, 26 pages.

*Primary Examiner* — Matthew C Landau
*Assistant Examiner* — David W Ward
(74) *Attorney, Agent, or Firm* — McCoy Russell LLP

(57) ABSTRACT

The present disclosure provides an organic light-emitting display substrate and a display device. The display substrate includes a base substrate, a driving circuit layer on the base substrate and a light-emitting device on one side of the driving circuit layer away from the base substrate. The light-emitting device includes a first electrode layer including separated first electrode patterns. The display substrate further includes a reflective metal layer insulated from the first electrode layer. An orthographic projection of each reflective metal pattern onto the base substrate overlaps an orthographic projection of at least two first electrode patterns onto the base substrate, which can appropriately reduce a thickness of an anode layer due to the presence of the reflective metal layer, thereby reducing segment difference of the light-emitting layer near the anode, improving the uniformity of the light-emitting layer, and improving performance of the display panel.

16 Claims, 6 Drawing Sheets

(51) Int. Cl.
    *H10K 59/35*         (2023.01)
    *H10K 59/80*         (2023.01)
    *H10K 59/122*      (2023.01)

(52) U.S. Cl.
    CPC ....... H10K 59/8051 (2023.02); H10K 59/878
          (2023.02); *H10K 59/122* (2023.02)

(58) Field of Classification Search
    CPC .. H10K 59/122; H10K 59/8051; H10K 50/81;
          H10K 59/35–353; H10K 50/85; H10K
          59/352–353; H10K 59/12; H10K
          2102/351; H10K 50/852; H10K 59/876;
          H10K 59/131; G02B 30/26
    See application file for complete search history.

(56) References Cited

U.S. PATENT DOCUMENTS

| | | | |
|---|---|---|---|
| 2007/0159043 A1 | 7/2007 | Kubota et al. | |
| 2008/0309232 A1* | 12/2008 | Yamamoto | H10K 59/876 |
| | | | 313/505 |
| 2011/0198623 A1 | 8/2011 | Matsushima | |
| 2011/0233576 A1 | 9/2011 | Okutani et al. | |
| 2015/0187858 A1* | 7/2015 | Wang | H10K 50/854 |
| | | | 257/40 |
| 2017/0077200 A1 | 3/2017 | Mou et al. | |
| 2018/0138245 A1* | 5/2018 | Akagawa | H10K 50/8428 |
| 2018/0151827 A1 | 5/2018 | Kang et al. | |
| 2019/0173011 A1* | 6/2019 | Kwak | H10K 59/353 |
| 2019/0214578 A1* | 7/2019 | Sugawara | H10K 85/631 |

| | | | |
|---|---|---|---|
| 2020/0152901 A1* | 5/2020 | Liu | H10K 59/122 |
| 2020/0243621 A1* | 7/2020 | Zhao | H10K 71/611 |
| 2020/0251657 A1* | 8/2020 | Jongman | H10K 59/124 |
| 2020/0328370 A1 | 10/2020 | Lee | |
| 2020/0381651 A1 | 12/2020 | Wang | |
| 2021/0066406 A1 | 3/2021 | Kim et al. | |
| 2021/0111323 A1* | 4/2021 | Kim | H10H 20/819 |
| 2021/0159452 A1 | 5/2021 | Yu et al. | |
| 2022/0059631 A1 | 2/2022 | Zhang et al. | |
| 2023/0033003 A1* | 2/2023 | Hou | H10K 71/00 |
| 2023/0165098 A1* | 5/2023 | Zhang | H10K 59/353 |
| | | | 257/40 |
| 2023/0238369 A1* | 7/2023 | Kusunoki | H10D 86/60 |
| | | | 257/79 |

FOREIGN PATENT DOCUMENTS

| | | | |
|---|---|---|---|
| CN | 101000922 A | 7/2007 | |
| CN | 101548409 A | 9/2009 | |
| CN | 102165592 A | 8/2011 | |
| CN | 103551607 A | 1/2014 | |
| CN | 104201190 A | 12/2014 | |
| CN | 105280684 A | 1/2016 | |
| CN | 109524575 A | 3/2019 | |
| CN | 109887959 A | 6/2019 | |
| CN | 109962087 A | 7/2019 | |
| CN | 110518142 A | 11/2019 | |
| CN | 110808274 A | 2/2020 | |
| CN | 111740035 A | 10/2020 | |
| CN | 111769205 A | 10/2020 | |
| IN | 102201431 A | 9/2011 | |
| KR | 20050098532 A | 10/2005 | |

* cited by examiner 107   103   104

108   106

B-B'

109   103   112

111

1

ORGANIC LIGHT-EMITTING DISPLAY SUBSTRATE AND DISPLAY DEVICE

CROSS REFERENCE TO RELATED APPLICATION

The present application is a U.S. National Phase of International Application No. PCT/CN2020/138592 entitled "ORGANIC LIGHT-EMITTING DISPLAY SUBSTRATE AND DISPLAY DEVICE," and filed on Dec. 23, 2020. The entire contents of the above-listed application is hereby incorporated by reference for all purposes.

TECHNICAL FIELD

The present disclosure relates to the field of display technologies, and in particular to an organic light-emitting display substrate and a display device.

BACKGROUND

Organic light-emitting diode (OLED) display technology has advantages such as high brightness, low power consumption, fast response and high definition. With development and maturity of the OLED display technology, OLED display devices are becoming more and more popular with users.

SUMMARY

Embodiments of the present disclosure provide an organic light-emitting display substrate and a display device, which can solve the problem that a segment difference may occur at an edge of an anode, which affects performance of the display panel.

According to a first aspect, one embodiment of the present disclosure provides an organic light-emitting display substrate, including: a base substrate, a driving circuit layer on the base substrate, and a light-emitting device on one side of the driving circuit layer away from the base substrate. The light-emitting device includes a first electrode layer; the first electrode layer includes a plurality of first electrode patterns separated from each other; the organic light-emitting display substrate further includes a reflective metal layer; the reflective metal layer is between the driving circuit layer and the first electrode layer; the reflective metal layer is insulated from the first electrode layer; the reflective metal layer includes a plurality of reflective metal patterns separated from each other; and an orthographic projection of each reflective metal pattern onto the base substrate overlaps an orthographic projection of at least two first electrode patterns onto the base substrate.

Optionally, the organic light-emitting display substrate further includes a plurality of first isolation structures; the plurality of first isolation structures are on one side of the first electrode layer away from the base substrate; the plurality of first isolation structures are sequentially arranged in parallel along a first direction; each of the plurality of first isolation structures extends in a second direction; in the first direction, each of the plurality of first isolation structures is between two adjacent light-emitting areas; the first direction and the second direction are different directions, and each light-emitting area includes a plurality of the light-emitting devices.

Optionally, the first electrode pattern is a long strip; the first electrode pattern extends along the first direction; the plurality of first electrode patterns are parallel to each other, and are arranged along the second direction.

Optionally, the first electrode pattern is electrically connected to the driving circuit layer through a via-hole; and an orthographic projection of the via-hole onto the base substrate overlaps an orthographic projection of the first isolation structure onto the base substrate.

Optionally, orthographic projections of via-holes corresponding to two first electrode patterns adjacent along the second direction, overlap different orthographic projections of different first isolation structures onto the base substrate, respectively.

Optionally, the reflective metal pattern has a trapezoid in a cross section perpendicular to the second direction; an orthographic projection of one base of the trapezoid away from the base substrate onto the base substrate, is within an orthographic projection of one base of the trapezoid close to the base substrate onto the base substrate; and a base angle of the trapezoid close to the base substrate is in a range from 30° to 60°.

Optionally, an orthographic projection of each first electrode pattern onto the base substrate, overlaps an orthographic projection of at most two first isolation structures onto the base substrate.

Optionally, the reflective metal pattern extends along the second direction; and each reflective metal pattern is between two adjacent first isolation structures.

Optionally, the organic light-emitting display substrate further includes a second isolation structures; wherein the second isolation structure is between two adjacent first isolation structures, and is connected to the two adjacent first isolation structures; and the second isolation structure extends along the first direction.

Optionally, the first isolation structures and the second isolation structures divide the organic light-emitting display substrate into a plurality of display sub-regions; there is a plurality of first electrode patterns in each of the plurality of display sub-regions; and the plurality of first electrode patterns in the same display sub-area are corresponding to sub-pixels of the same color.

Optionally, the organic light-emitting display substrate further includes third isolation structures; wherein the third isolation structure extends along the first direction; each third isolation structure is in contact with edges of multiple first isolation structures in the second direction.

Optionally, the organic light-emitting display substrate further includes an organic planarization layer and an inorganic protection layer sequentially arranged in a direction away from the base substrate; the organic planarization layer and the inorganic protection layer are between the driving circuit layer and the reflective metal layer; and a range of an orthographic projection of the reflective metal layer onto the base substrate is within a range of the inorganic protection layer.

Optionally, the inorganic protection layer includes a plurality of inorganic protection layer patterns separated from each other; an orthographic projection of each inorganic protection layer pattern onto the base substrate is between orthographic projections of two adjacent first isolation structures onto the base substrate.

Optionally, the reflective metal layer is made of silver; the inorganic protection layer is made of indium tin oxide; and the reflective metal layer is in direct contact with the inorganic protection layer.

According to a second aspect, one embodiment of the present disclosure provides a display device, including any one of the organic light-emitting display substrates in the first aspect.

In the embodiments of the present disclosure, the organic light-emitting display substrate includes: a base substrate, a driving circuit layer on the base substrate, and a light-emitting device on one side of the driving circuit layer away from the base substrate. The light-emitting device includes a first electrode layer; the first electrode layer includes a plurality of first electrode patterns separated from each other; the organic light-emitting display substrate further includes a reflective metal layer; the reflective metal layer is between the driving circuit layer and the first electrode layer; the reflective metal layer is insulated from the first electrode layer; the reflective metal layer includes a plurality of reflective metal patterns separated from each other; and an orthographic projection of each reflective metal pattern onto the base substrate overlaps an orthographic projection of at least two first electrode patterns onto the base substrate. In the embodiment of the present disclosure, by providing the reflective metal layer and enabling the orthographic projection of the reflective metal pattern onto the base substrate to overlap the orthographic projection of at least two first electrode patterns onto the base substrate, the thickness of the anode layer can be appropriately reduced due to the presence of the reflective metal layer, which helps to reduce the segment difference of the light-emitting layer near the anode, improves the uniformity of the light-emitting layer, and helping to improve performance of the display panel.

BRIEF DESCRIPTION OF THE DRAWINGS

In order to illustrate technical solutions according to embodiments of the present disclosure more clearly, drawings to be used in the description of the embodiments of the present disclosure will be described briefly hereinafter. Apparently, the drawings described hereinafter are only some embodiments of the present disclosure, and other drawings may be obtained by those skilled in the art according to those drawings without creative work.

DETAILED DESCRIPTION

The technical solutions in embodiments of the present disclosure will be described hereinafter in a clear and complete manner in conjunction with the drawings of the embodiments of the present disclosure. Obviously, the described embodiments are merely a part of, rather than all of, the embodiments of the present disclosure, and based on these embodiments, a person skilled in the art may obtain the other embodiments, which also fall within the scope of the present disclosure.

The present disclosure provides an organic light-emitting display substrate.

Referring to FIG. 1 to FIG. 12, in one embodiment, the organic light-emitting display substrate includes a base substrate 101, a driving circuit layer 102 on the base substrate 101, and a light-emitting device on one side of the driving circuit layer 102 away from the base substrate 101.

In this embodiment, the driving circuit layer 102 at least includes a thin film transistor (TFT); and the light-emitting device at least includes a first electrode layer, a light-emitting layer and a second electrode layer that are stacked on each other.

Figure 1:
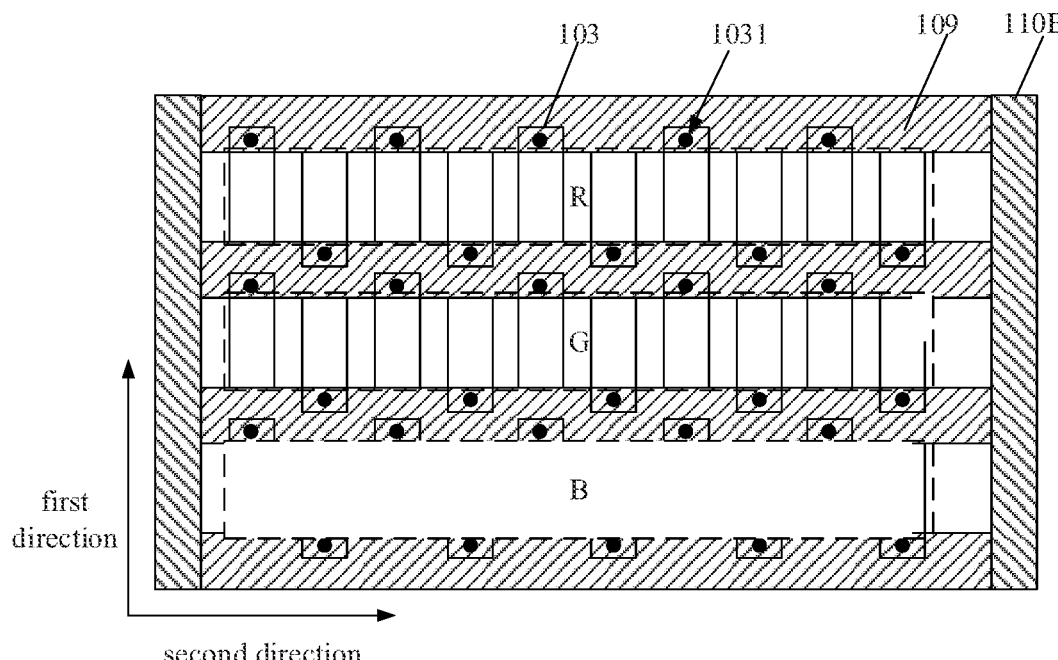
FIG. 1 is a schematic structural diagram of an organic light-emitting display substrate according to an embodiment of the present disclosure.
Figure 2:
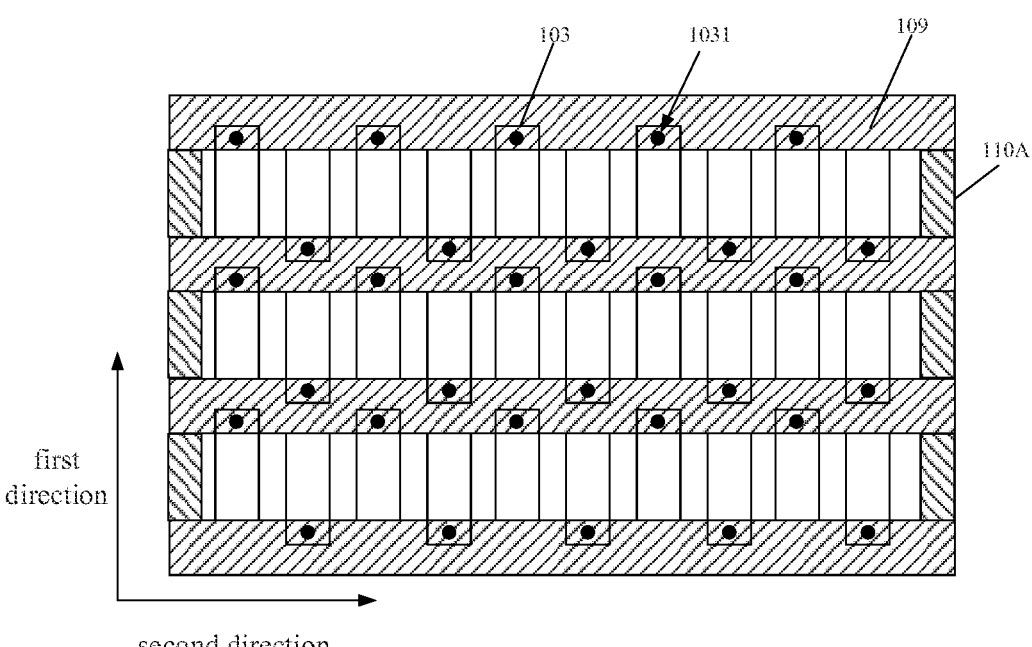
FIG. 2 is a schematic structural diagram of another organic light-emitting display substrate according to an embodiment of the present disclosure.
Figures 11, 12:
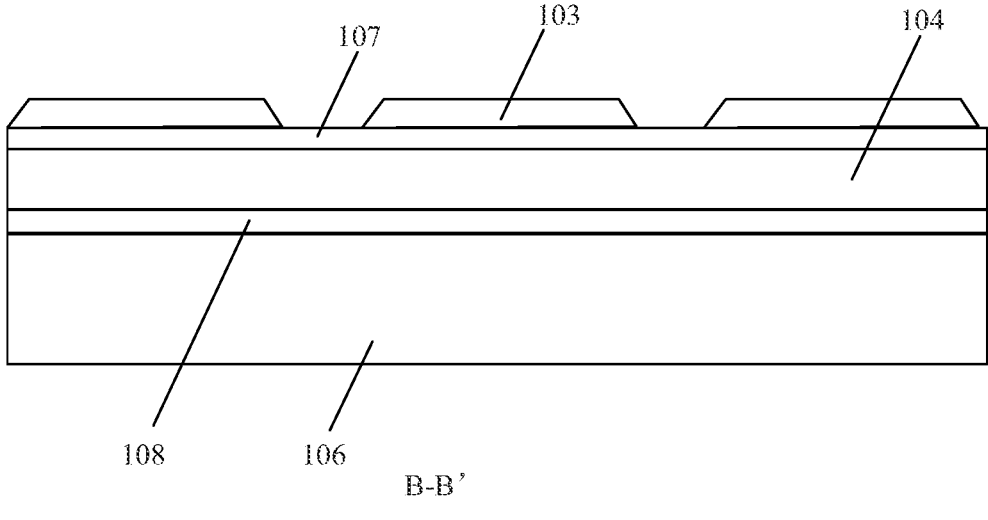
FIG. 11 is a cross-sectional view taken along a line B-B' in FIG. 7.
FIG. 12 is a schematic diagram showing relative positions of a first electrode layer, a light-emitting layer and a second electrode layer according to an embodiment of the present disclosure.

As shown in FIG. 1, FIG. 2 and FIG. 11, the first electrode layer may be an anode of the light-emitting device. The first electrode layer includes a plurality of first electrode patterns 103 separated from each other. The various first electrode patterns 103 are insulated from each other. The second electrode layer may be a common cathode of the light-emitting device.

Figure 10:
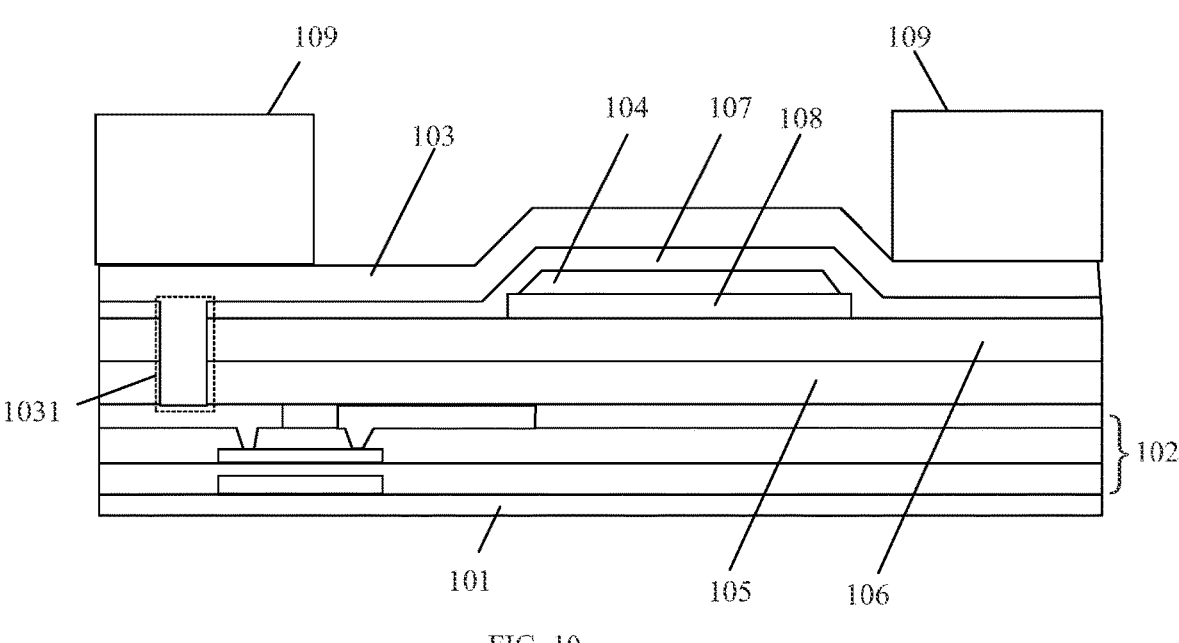
FIG. 10 is a cross-sectional view taken along a line A-A' in FIG. 7.

As shown in FIG. 10, the organic light-emitting display substrate further includes a reflective metal layer 104. The reflective metal layer 104 is between the driving circuit layer 102 and the first electrode layer. The reflective metal layer 104 may be made of metals with a certain reflectivity, including but not limited to argentum (Ag), aluminum (Al), etc. The reflective metal layer 104 is used to reflect light rays emitted by the light-emitting device, which helps to improve display brightness.

A thickness of the reflective metal layer 104 may be controlled between 80 nanometers and 120 nanometers, for example, 100 nanometers. The thickness of the reflective metal layer 104 may be set according to reflectivity of the material. Generally speaking, the higher the reflectivity of the selected material, the lower the thickness of the reflective metal layer 104.

As shown in FIG. 10, the reflective metal layer 104 is insulated from the first electrode layer. As shown in FIG. 1 and FIG. 11, the reflective metal layer 104 includes a plurality of reflective metal patterns separated from each other. An orthographic projection of each reflective metal pattern onto the base substrate 101 overlaps an orthographic projection of at least two first electrode patterns 103 onto the base substrate 101.

As shown in FIG. 11, there are multiple reflective metal patterns, and each reflective metal pattern corresponds to multiple first electrode patterns 103.

It can be understood that multiple first electrode patterns 103 are located at one side of an identical reflective metal pattern away from the base substrate 101. Due to the presence of the reflective metal layer 104, a thickness of an anode layer can be appropriately reduced. In this way, in subsequent fabrication of the light-emitting layer of the light-emitting device, a segment difference between the light-emitting layer in a region corresponding to the first electrode pattern 103 and the light-emitting layer in a region outside the first electrode pattern 103 is relatively small, which helps to improve film-forming uniformity of the light-emitting layer.

In the embodiment of the present disclosure, by providing the reflective metal layer 104 and enabling the orthographic projection of the reflective metal pattern onto the base substrate 101 to overlap the orthographic projection of at least two first electrode patterns 103 onto the base substrate 101, the thickness of the anode layer can be appropriately reduced due to the presence of the reflective metal layer 104, which helps to reduce the segment difference of the light-emitting layer near the anode, improves the uniformity of the light-emitting layer, and helping to improve performance of the display panel.

Figure 8:
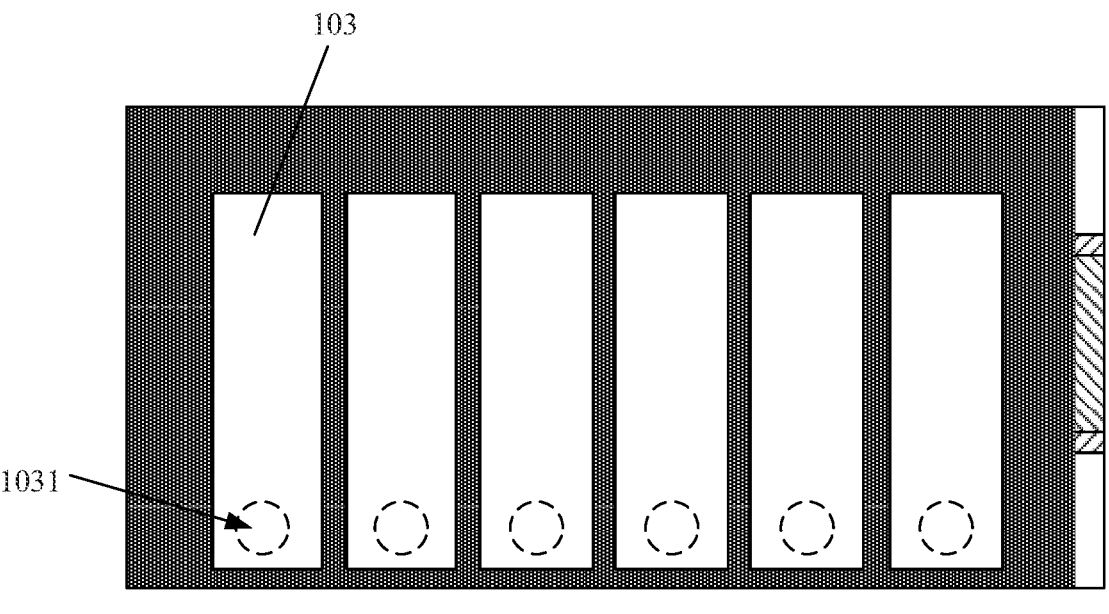
FIG. 8 is a schematic diagram showing another laminated structure of an organic planarization layer, an inorganic protection layer, a reflective metal layer, an insulating layer and a first electrode layer according to an embodiment of the present disclosure.

According to the technical solution of this embodiment, a driving circuit layer 102 is firstly fabricated on a base substrate 101. The driving circuit layer 102 includes a TFT. The TFT usually includes a first electrode, a second electrode, and a control electrode. The first electrode and the second electrode may source and drain electrodes of the TFT, respectively. The control electrode may be a gate electrode of the TFT. The driving circuit layer 102 generally includes an active layer, a gate insulating layer, a gate layer, a source-drain metal layer and other structures. As shown in FIG. 8, the first electrode pattern 103 is connected to the first electrode or the second electrode of the TFT in the driving circuit layer 102.

The organic light-emitting display substrate may further include an insulating protection layer 105. The insulating protection layer 105 is used to protect the TFT. The insulating protection layer 105 is usually made of inorganic materials, such as silicon oxide or silicon nitride. The insulating protection layer 105 is between the TFT and the reflective metal layer 104. A thickness of the insulating protection layer 105 is about 1 to 2 microns, more specifically, it may be controlled to be 1.3 to 1.6 microns, for example, 1.5 microns.

Figure 3:
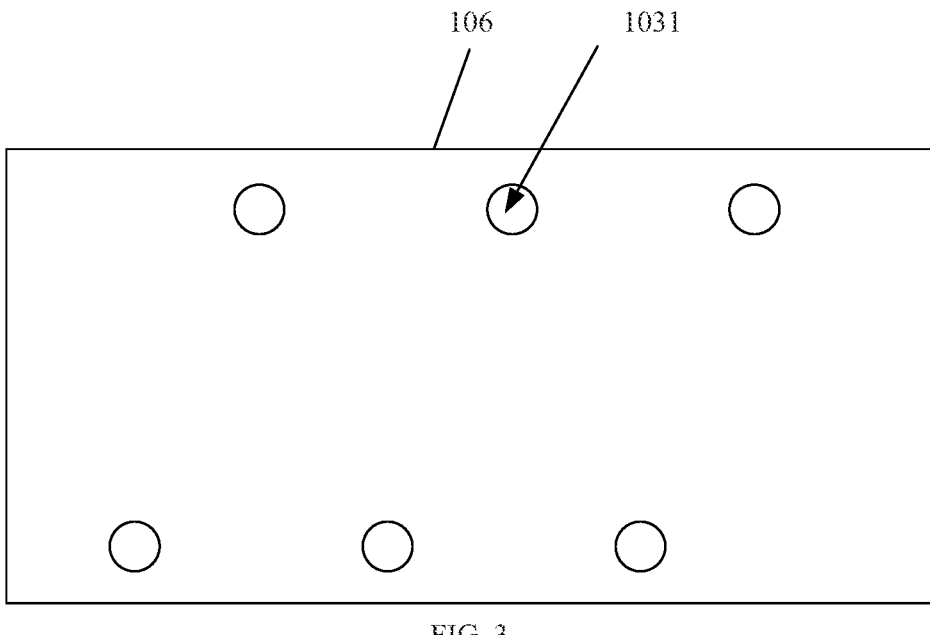
FIG. 3 is a schematic structural diagram of an organic planarization layer according to an embodiment of the present disclosure.

As shown in FIG. 3, in some embodiments, a planarized organic planarization layer 106 is fabricated on the insulating protection layer 105, which helps to improve reliability of the first electrode pattern 103 which is subsequently prepared. It should be understood that a via-hole 1031 in the organic planarization layer 106 shown in FIG. 3 is not opened after the material of the organic planarization layer 106 is deposited, but before the first electrode layer is fabricated.

Figure 4:
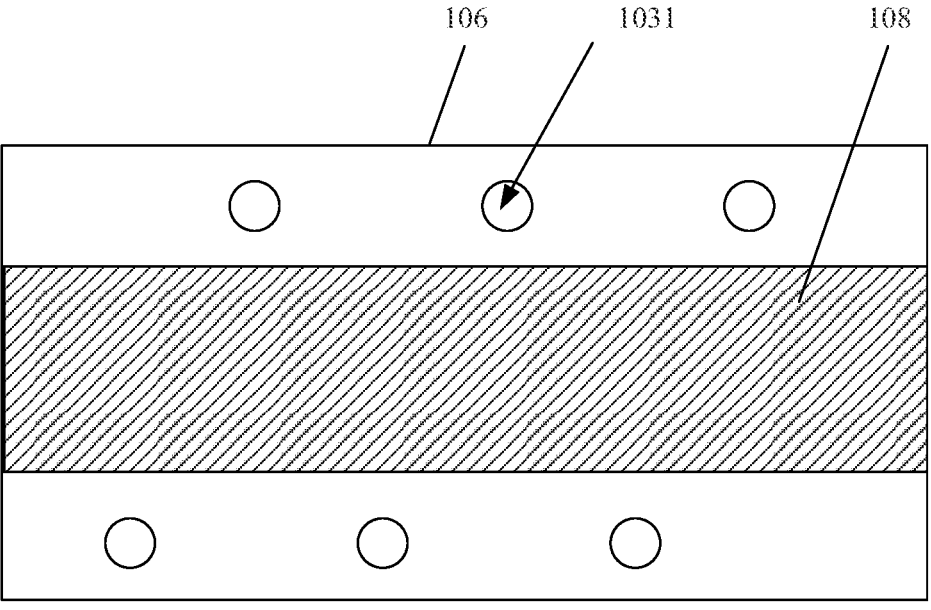
FIG. 4 is a schematic diagram showing a laminated structure of an organic planarization layer and an inorganic protection layer according to an embodiment of the present disclosure.

As shown in FIG. 4 and FIG. 10, in some embodiments, an inorganic protection layer 108 may be further included between the insulating protection layer 105 and the reflective metal layer 104. That is, the organic planarization layer 106 and the inorganic protection layer 108 are between the driving circuit layer 102 and the reflective metal layer 104, and the reflective metal layer 104 is in direct contact with the inorganic protection layer 108.

Figure 5:
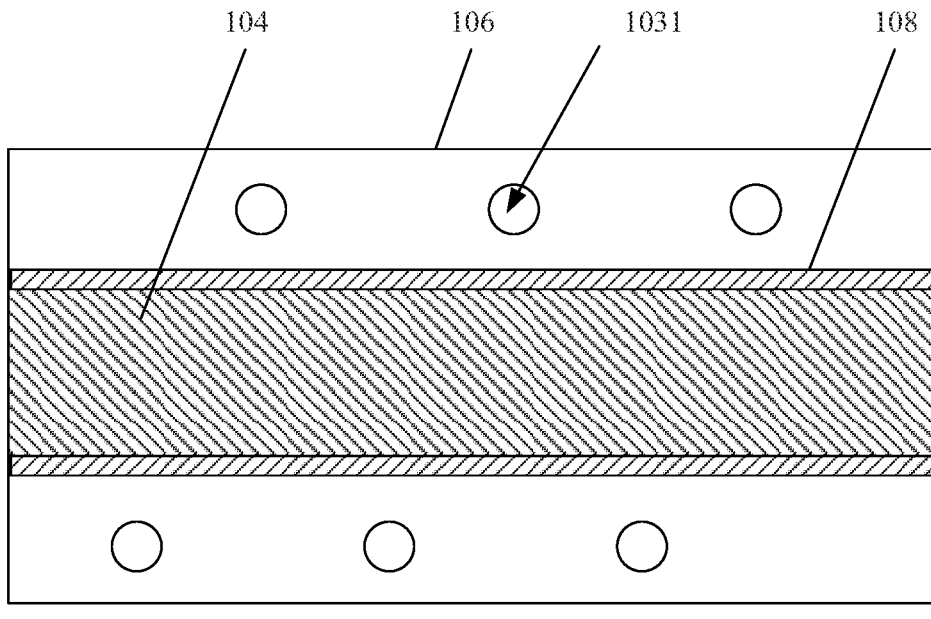
FIG. 5 is a schematic diagram showing a laminated structure of an organic planarization layer, an inorganic protection layer and a reflective metal layer according to an embodiment of the present disclosure.

As shown in FIG. 5 and FIG. 10, after the fabrication of the inorganic protection layer 108 is completed, the reflective metal layer 104 is fabricated. Specifically, after insulating material of the inorganic protection layer 108 is deposited, material of the reflective metal layer 104 is deposited. Then, the material of the reflective metal layer 104 is patterned to obtain reflective metal patterns.

It can be understood that the organic light-emitting display substrate includes the insulating protection layer 105, the organic planarization layer 106, the inorganic protection layer 108 and the reflective metal layer 104; and the insulating protection layer 105, the organic planarization layer 106, the inorganic protection layer 108 and the reflective metal layer 104 are stacked in sequence along a direction away from the base substrate 101.

It should be understood that the material of the reflective metal layer 104 may include metals such as silver or aluminum, which have relatively high activity and may react with organic materials in the organic planarization layer 106, thereby affecting structure performance. In this embodiment, the material of the inorganic protection layer 108 may include indium tin oxide. The presence of the inorganic protection layer 108 can reduce the possibility that the reflective metal layer 104 with higher activity contacts and reacts with the organic planarization layer 106, which helps to reduce possible adverse effects on the performance of the organic light-emitting display substrate.

A range of the inorganic protection layer 108 is greater larger than a range of the reflective metal layer 104, thereby further reducing the possibility that the reflective metal layer 104 contacts the organic planarization layer 106.

Figure 6:
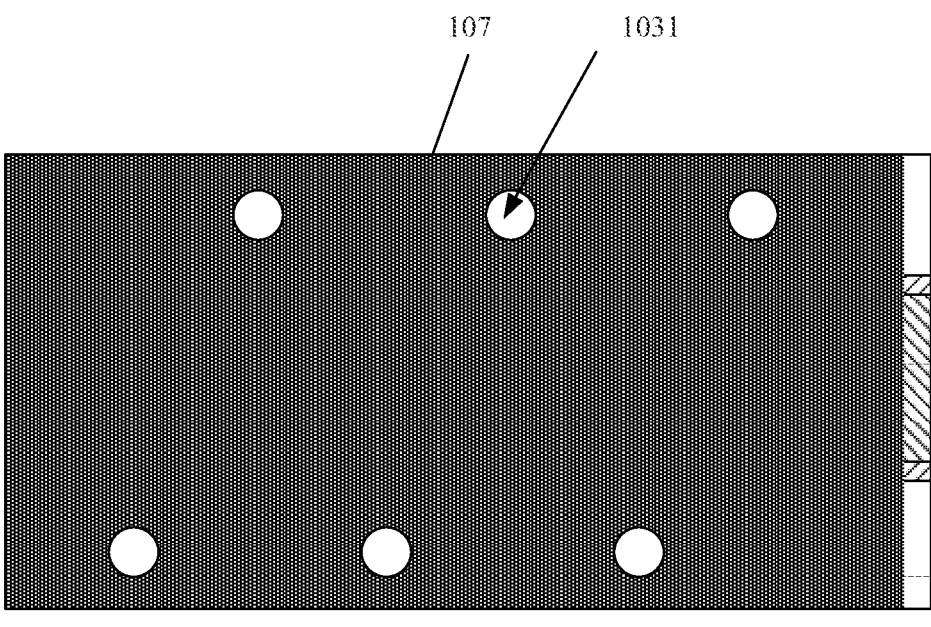
FIG. 6 is a schematic diagram showing a laminated structure of an organic planarization layer, an inorganic protection layer, a reflective metal layer and an insulating layer according to an embodiment of the present disclosure.

As shown in FIG. 6, after the reflective metal patterns are formed by patterning the material of the reflective metal layer 104, an insulating layer 107 is further fabricated.

The insulating layer 107 is used to achieve insulation between the reflective metal layer 104 and the first electrode pattern 103, to avoid conduction between the reflective metal layer 104 and the first electrode pattern 103, thereby avoiding possible influence on the display effect. A thickness of the insulating layer may be controlled within 20 to 30 nanometers.

The insulating layer 107 may also be used to protect the reflective metal layer 104. The orthographic projection of the reflective metal pattern onto the base substrate 101 is within a range of an orthographic projection of the insulating layer 107 onto the base substrate 101. It can be understood that the insulating layer 107 covers all the reflective metal layer 104, which helps to improve the protection effect of the metal layer and reduce the possibility of the metal layer being oxidized.

In some embodiments, as shown in FIG. 10, the reflective metal pattern has a trapezoid in a cross section perpendicular to a second direction. An orthographic projection of one base of the trapezoid away from the base substrate 101 onto the base substrate 101, is within an orthographic projection of one base of the trapezoid close to the base substrate 101 onto the base substrate 101. A base angle of the trapezoid close to the base substrate 101 is in a range from 30 to 60°.

It can be understood as that a width of the reflective metal pattern gradually decreases in a direction away from the base substrate 101, so that the cross-section of the reflective metal pattern is a trapezoid. Here, the width of the reflective metal pattern refers to a line width of the reflective metal pattern in a first direction. The base angle of the trapezoid close to the base substrate 101 is in a range from 30 to 60°, which can be understood as that a climbing height of the first electrode pattern 103 is equivalent to the thickness of the reflective metal pattern, and a climbing angle of the first electrode pattern 103 is approximately equal to the base angle of the trapezoid close to the base substrate. Controlling the base angle of the trapezoid to be relatively small, can reduce the climbing height of the first electrode pattern 103 on the reflective metal pattern, thereby improving wiring reliability of the first electrode pattern 103.

As shown in FIG. 6, a via-hole 1031 is subsequently defined in the organic light-emitting display substrate. The via-hole 1031 extends in a direction perpendicular to the base substrate 101. The via-hole 1031 may be defined by a dry etching process. The via-hole 1031 is defined in an area outside the reflective metal pattern. The via-hole 1031 extends through the insulating layer 107, the organic planarization layer 106, and the insulating protection layer 105 to expose the first electrode or the second electrode of the TFT.

Figure 7:
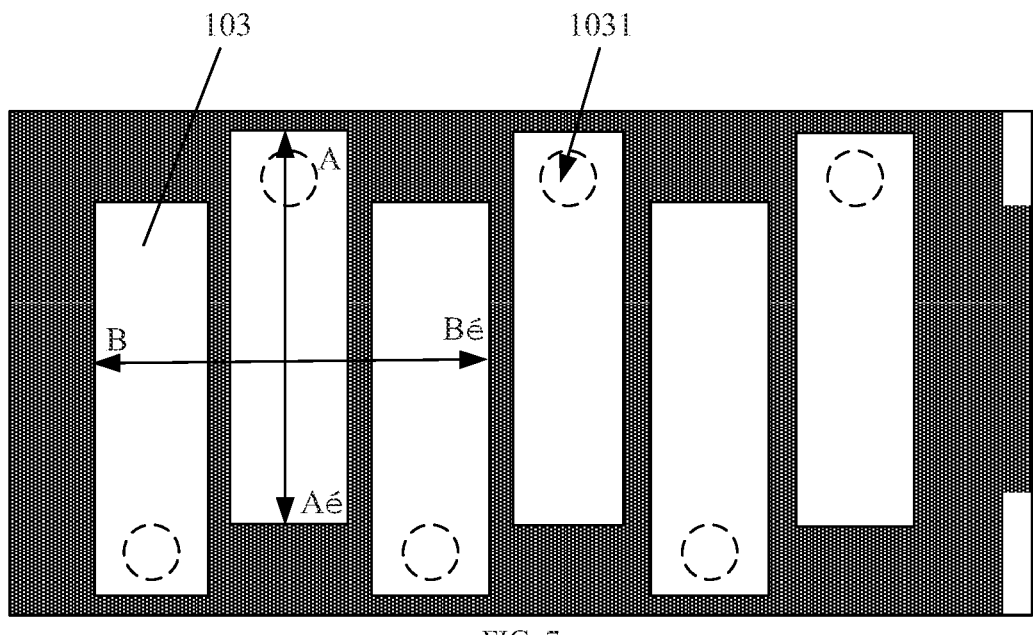
FIG. 7 is a schematic diagram showing a laminated structure of an organic planarization layer, an inorganic protection layer, a reflective metal layer, an insulating layer and a first electrode layer according to an embodiment of the present disclosure.

As shown in FIG. 7 and FIG. 8, material of the first electrode layer is formed subsequently. For example, an indium tin oxide layer may be formed by magnetron sputtering as the material of the first electrode layer, and then the material of the first electrode layer is patterned to obtain a plurality of first electrode patterns 103. As shown in FIG. 7, the first electrode pattern 103 is electrically connected to the TFT through the via-hole 1031. In this embodiment, positions of via-holes are exemplarily shown by dotted lines.

Figure 9:
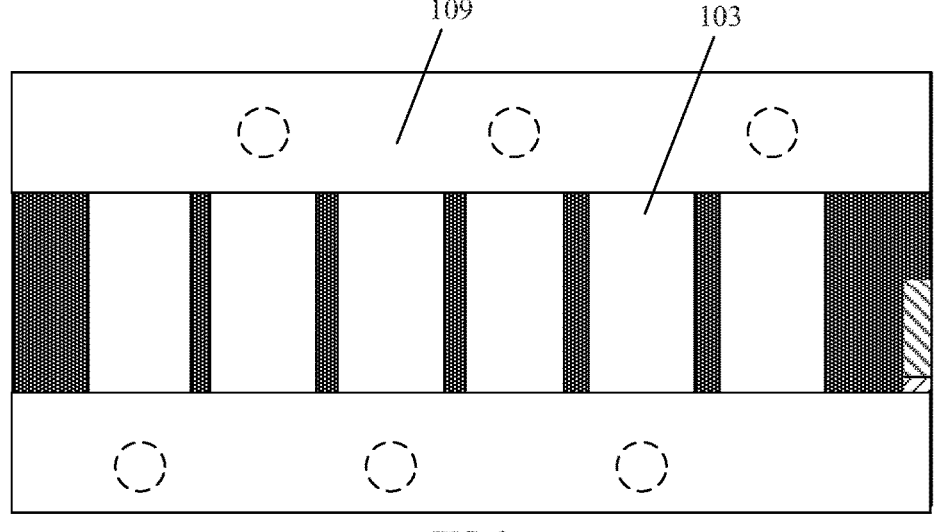
FIG. 9 is a schematic diagram showing a laminated structure of an organic planarization layer, an inorganic protection layer, a reflective metal layer, an insulating layer and a first isolation structure according to an embodiment of the present disclosure.

As shown in FIG. 9, in some embodiments, the organic light-emitting display substrate further includes a plurality of first isolation structures 109. The first isolation structure 109 is located at one side of the first electrode layer away from the base substrate 101.

As shown in FIG. 9, after the material of the first electrode layer is patterned, the first isolation structure 109 is fabricated.

As shown in FIG. 1 and FIG. 9, the first isolation structure 109 is elongated. Multiple first isolation structures 109 are arranged in parallel along the first direction, and each first isolation structure 109 extends along the second direction. Along the first direction, the first isolation structures 109 and light-emitting areas are alternately arranged. The first direction and the second direction are different directions.

As shown in FIG. 1 and FIG. 2, in the first direction, the first isolation structure 109 is between two adjacent light-emitting areas. In other words, in the first direction, one light-emitting area is between two adjacent first isolation structures 109. There is a plurality of light-emitting devices in each light-emitting area.

It can be understood as that the reflective metal pattern extends along the second direction, and each reflective metal pattern is between two adjacent first isolation structures 109, and each reflective metal pattern overlaps a plurality of first electrode patterns 103.

In an optional embodiment, in case that the organic light-emitting display substrate includes the inorganic protection layer 108, the inorganic protection layer 108 includes a plurality of inorganic protection layer patterns separated from each other. Each inorganic protection layer pattern is between two adjacent first isolation structures 109.

Each first electrode pattern 103 corresponds to one light-emitting device. There are multiple light-emitting devices in each light-emitting area. The first electrode patterns 103 of the multiple light-emitting devices identical one light-emitting area overlap identical one reflective metal pattern. Along the first direction, the light-emitting area and the first isolation structure 109 are alternately arranged. Each of the light-emitting area and the first isolation structure 109 extends along the second direction.

In this embodiment, a thickness of the first isolation structure 109 is about 1 to 2 microns. For example, in one embodiment, the thickness of the first isolation structure 109 is 1.5 microns. A length of the first isolation structure 109 in the second direction is set according to sizes of pixels. Generally speaking, the length of the first isolation structure 109 is not less than 15 microns. A distance between two adjacent first isolation structures is about 29 to 34 microns.

It should be understood that the distance between two adjacent first isolation structures is actually a width of one light-emitting area, and the length of the first isolation structure 109 in the second direction is actually a length of one light-emitting area.

In some embodiments, as shown in FIG. 1 and FIG. 2, the first electrode pattern 103 is a long strip, and the first electrode pattern 103 extends along the first direction. Multiple first electrode patterns 103 are parallel to each other. The multiple first electrode patterns 103 are arranged in the second direction.

In some embodiments, a length of each first electrode pattern 103 in the first direction is greater than the distance, i.e., about 29 to 34 microns, between two adjacent first isolation structures 109. A distance between two adjacent first electrode patterns 103 in the second direction is 2 to 4 microns. A width of each first electrode pattern 103 is 15 to 18 microns.

In some embodiments, the first electrode pattern 103 is electrically connected to the driving circuit layer 102 through the via-hole 1031 that extends in a direction perpendicular to the base substrate 101. An orthographic projection of the via-hole 1031 onto the base substrate 101 overlaps an orthographic projection of the first isolation structure 109 onto the base substrate 101. It should be understood that an area of each first electrode pattern 103 located between two adjacent first isolation structures 109 is equivalent to an aperture area of each sub-pixel. Therefore, in this embodiment, the via-hole 1031 is defined in an area where the isolation structure 109 is located.

As shown in FIG. 7, in some embodiments, orthographic projections of the via-holes 1031, which are corresponding to two first electrode patterns 103 adjacent in the second direction, onto the base substrate 101, overlap different orthographic projections of different first isolation structures 109 onto the base substrate 101, respectively, which helps to improve the uniformity of the thickness of each first isolation structure 109, thereby helping to improve the display effect.

It can be understood as that the via hole-hole 1031 corresponding to the first one of first electrode patterns 103 from the left overlaps a lower first isolation structure 109 shown in FIG. 7; the via hole-hole 1031 corresponding to the second one of first electrode patterns 103 from the left overlaps the upper first isolation structure 109 shown in FIG. 7; the via hole-hole 1031 corresponding to the third one of first electrode patterns 103 from the left overlaps the lower first isolation structure 109 shown in FIG. 7, . . . and so on.

In some other embodiments, as shown in FIG. 8, orthographic projections of the via-holes 1031, which are corresponding to two adjacent first electrode patterns 103, onto the base substrate 101, overlap an orthographic projection of identical one first isolation structure 109 onto the base substrate 101, respectively.

It can be understood as that the via-hole 1031 corresponding to each first electrode pattern 103 overlaps the lower first isolation structure 109 shown in FIG. 8.

Further, in some optional embodiments, the various first electrode patterns 103 are arranged in alignment. It can be understood as that the via-holes 1031 of the various first electrode patterns 103 are on an identical straight line, and upper and lower edges of various first electrode patterns 103 are parallel to each other when the first electrode patterns 103 are in orientation shown in FIG. 8.

In some embodiments, the orthographic projection of each first electrode pattern 103 onto the base substrate 101 overlaps an orthographic projection of at most two first isolation structures 109 onto the base substrate 101.

In some embodiments, each first electrode pattern 103 may overlap only one first isolation structure 109. That is, one first electrode pattern 103 may overlap only one first isolation structure 109 which is corresponding to the via-hole 1031 of the one first electrode pattern 103, and one end of the one first electrode pattern 103 away from the via-hole 1031 extends only to an adjacent first isolation structure 109 and does not overlap the adjacent first isolation structure 109.

As shown in FIG. 7 and FIG. 8, in some other embodiments, each first electrode pattern 103 overlaps two first isolation structures 109. That is, one first electrode pattern 103 may overlap one first isolation structure 109 which is corresponding to the via-hole 1031 of the one first electrode pattern 103, and one end of the one first electrode pattern 103 away from the via-hole 1031 extends to an adjacent first isolation structure 109 and overlaps the adjacent first isolation structure 109.

The first isolation structure 109 may be made of materials with relatively strong hydrophobicity. As shown in FIG. 12, after fabrication of the first isolation structure 109 is completed, a light-emitting layer 111 and a second electrode layer 112 of the light-emitting device may be formed by printing in the formed light-emitting area. The second electrode layer 112 may be a cathode layer of the light-emitting device. The formed light-emitting layer has high film-forming consistency and uniformity, which helps to improve the display effect.

As shown in FIG. 12, the light-emitting layer 111 is formed between two adjacent first isolation structures 109, and the second electrode layer 112 is an entire-surface electrode structure. Because the first electrode layer is covered by the light-emitting layer 111 and the second electrode layer 112, positions of various first electrode patterns 103 and via-holes of the first electrode layer are exemplarily indicated by dotted lines in this embodiment.

It should be understood that, along a direction from the first electrode layer to the second electrode layer 112, a hole injection layer, a hole transport layer, the light-emitting layer 111 and an electron transport layer may be stacked in sequence between the first electrode layer and the second electrode layer 112.

In some embodiments, an electron blocking layer may be further provided between the hole transport layer and the light-emitting layer 111, and a hole blocking layer may further be provided between the light-emitting layer 111 and the electron transport layer. It should be understood that under normal circumstances, in order to ensure the display effect, injected electrons are excessive, and then the electron blocking layer is usually provided, but the hole blocking layer may be omitted.

In some embodiments, a range of an orthographic projection of the hole injection layer, the hole transport layer, the electron transport layer and the electron injection layer onto the base substrate 101 is greater than the orthographic projection of the first electrode pattern 103 onto the base substrate 101, or overlaps the orthographic projection of the first electrode pattern 103 onto the base substrate 101.

In some other embodiments, a range of an orthographic projection of one or more of the hole injection layer, the hole transport layer, the electron transport layer and the electron injection layer onto the base substrate 101 may be greater than the orthographic projection of the light-emitting layer 111 onto the base substrate 101, or overlaps the orthographic projection of the light-emitting layer 111 onto the base substrate 101.

For example, in one embodiment, an orthographic projection of each of the hole injection layer, the hole transport layer, the electron transport layer and the electron injection layer onto the base substrate overlaps the orthographic projection of the light-emitting layer 111 onto the base substrate 101.

In this embodiment, the light-emitting layer is formed in an area between two adjacent first isolation structures 109, i.e., the foregoing light-emitting area. The via-hole 1031 is defined in an area outside the light-emitting area, i.e., an area where the first isolation structure 109 is located.

In some embodiments, the organic light-emitting display substrate further includes a second isolation structure 110A.

As shown in FIG. 2, in some optional embodiments, the second isolation structure 110A is between two adjacent first isolation structures 109, and is connected to the two adjacent first isolation structures 109. The second isolation structure 110A extends in the first direction.

It can be understood as that the first isolation structure 109 and the second isolation structure 110A are alternately arranged. One light-emitting area is defined by two first isolation structures 109 adjacent in the first direction and two second isolation structures 110A adjacent in the second direction.

In some embodiments, the organic light-emitting display substrate further includes a third isolation structure 110B.

As shown in FIG. 1, in some optional embodiments, the third isolation structure 110B is located at an end of the first isolation structure and extends along the first direction. Each third isolation structure 110B is in contact with edges of multiple first isolation structures 109 in the second direction. It may also be understood as that multiple first isolation structures 109 are sequentially arranged in parallel between two adjacent third isolation structures 110B.

As shown in FIG. 1, in some embodiments, each light-emitting area defined by the first isolation structures 109 and the third isolation structures 110B serves as a display sub-region. Alternatively, as shown in FIG. 2, each light-emitting area defined by the first isolation structure 109 and the second isolation structures 110A serves as a display sub-region.

The light-emitting layer in the same display sub-region is obtained by printing the same material. Therefore, each display sub-region corresponds to sub-pixels of the same color.

As shown in FIG. 1 and FIG. 2, in some embodiments, each light-emitting area defined by the first isolation structures 109 and the second isolation structures 110A or each light-emitting area defined by the first isolation structures 109 and the third isolation structures 110B serves as a sub-pixel, and luminous colors of two rows adjacent along the first direction are different. That is, two sub-pixels adjacent along the first direction are sub-pixels of different colors.

Hereinafter, one light-emitting area including twelve first electrode patterns 103 is taken as an example for description. Apparently, the number of first electrode patterns 103 in each light-emitting area is not limited to this.

During a display control process, the twelve first electrode patterns 103 are corresponding to one sub-pixel and are controlled synchronously. Multiple sub-pixels along the first direction constitute one pixel.

Referring to FIG. 1, along the first direction, colors of various sub-pixels may be red (R), green (G), blue (B), red (R), green (G), blue (B) . . . and so on. Each group of three sub-pixels including red (R), green (G), blue (B) sub-pixels constitute one pixel. Apparently, the colors of the sub-pixels, arrangements of the sub-pixels, and the number of sub-pixels included in each pixel are not limited to this.

In some other embodiments, each light-emitting area defined by the first isolation structures 109 and the second isolation structures 110A, or each light-emitting area defined by the first isolation structures 109 and the third isolation structures 110B, includes multiple sub-pixels.

Similarly, one light-emitting area including twelve first electrode patterns 103 is taken as an example for description. During the display control process, the light-emitting devices corresponding to multiple ones of the twelve first electrode patterns 103 may be controlled synchronously. Specifically, every three first electrode patterns 103 are divided into a group and controlled simultaneously. In this way, it is equivalent that three first electrode patterns 103 are corresponding to one sub-pixel, and one light-emitting area includes four sub-pixels. Further, multiple sub-pixels in the first direction constitute one pixel. Arrangement of the pixels may refer to but not limited to the arrangement of pixels in the forgoing embodiment, which is more suitable for two dimensional (2D) display.

In some other embodiments, each first electrode pattern 103 is corresponding to one sub-pixel.

One light-emitting area including twelve first electrode patterns 103 is taken as an example for description. One light-emitting area actually includes twelve sub-pixels, and multiple sub-pixels along the first direction constitute one pixel. Arrangement of pixels may refer to but is not limited to the arrangement of pixels in the foregoing embodiments.

It should be understood that the technical solution of this embodiment is more suitable for a three dimensional (3D) display device. That is, the base substrate 101 may be made of a flexible material, various sub-pixels are not on the same plane, and the sub-pixel corresponding to each first electrode pattern 103 is individually controlled, thereby improving the display effect. One embodiment of the present disclosure further provides a display device, including any one of the foregoing organic light-emitting display substrates. The display device may be one of a mobile phone, a tablet computer, an e-book reader, a digital camera, a laptop portable computer, a vehicle-mounted computer, a desktop computer, a television, and a wearable device.

Since this embodiment of the present disclosure include all the technical solutions of the foregoing organic light-emitting display substrate embodiments, this embodiment of the present disclosure can at least achieve all the foregoing technical effects, which will not be repeated here.

The above are merely the embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. The protection scope of the present disclosure shall be subject to the protection scope of the claims.

The invention claimed is:

1. An organic light-emitting display substrate, comprising:

a base substrate;

a driving circuit layer on the base substrate; and, a plurality of light-emitting devices on one side of the driving circuit layer away from the base substrate;

wherein each of the plurality of the light-emitting devices includes a first electrode layer; the first electrode layer includes a plurality of first electrode patterns separated from each other; the organic light-emitting display substrate further includes a reflective metal layer; the reflective metal layer is between the driving circuit layer and the first electrode layer; the reflective metal layer is insulated from the first electrode layer; the reflective metal layer includes a plurality of reflective metal patterns separated from each other; and an orthographic projection of each reflective metal pattern onto the base substrate overlaps an orthographic projection of at least two first electrode patterns onto the base substrate;

wherein the organic light-emitting display substrate further includes a plurality of first isolation structures; the plurality of first isolation structures are on one side of the first electrode layer away from the base substrate; the plurality of first isolation structures are sequentially arranged in parallel along a first direction; each of the plurality of first isolation structures extends in a second direction; in the first direction, each of the plurality of first isolation structures is between two adjacent light-emitting areas of a plurality of light-emitting areas; the first direction and the second direction are different directions, and each light-emitting area includes some of the plurality of the light-emitting devices;

wherein the first electrode pattern is electrically connected to the driving circuit layer through a via-hole; and an orthographic projection of the via-hole onto the base substrate overlaps an orthographic projection of the first isolation structure onto the base substrate;

wherein in the first direction, each light-emitting area is between two adjacent first isolation structures, the two adjacent first isolation structures are respectively located on a first side of the light-emitting area and a second side of the light-emitting area, the first side and the second side of the light-emitting area are opposite sides in the first direction;

wherein in each light-emitting area, along the second direction, an orthographic projection of a via-hole corresponding to one of two adjacent first electrode patterns overlaps the orthographic projection of a first isolation structure on the first side of the light-emitting area onto the base substrate and does not overlap the orthographic projection of a first isolation structure on the second side of the light-emitting area onto the base substrate, and an orthographic projection of a via-hole corresponding to the other of the two adjacent first electrode patterns overlaps an orthographic projection of a first isolation structure on the second side of the light-emitting area onto the base substrate and does not overlap the orthographic projection of a first isolation structure on the first side of the light-emitting area onto the base substrate.

2. The organic light-emitting display substrate of claim 1, wherein the first electrode pattern is a long strip; the first electrode pattern extends along the first direction; the plurality of first electrode patterns are parallel to each other, and are arranged along the second direction.

3. The organic light-emitting display substrate of claim 1, wherein orthographic projections of via-holes corresponding to two first electrode patterns adjacent along the second direction, overlap different orthographic projections of different first isolation structures onto the base substrate, respectively.

4. The organic light-emitting display substrate of claim 3, wherein the reflective metal pattern has a trapezoid in a cross section perpendicular to the second direction; an orthographic projection of one base of the trapezoid away from the base substrate onto the base substrate, is within an orthographic projection of one base of the trapezoid close to the base substrate onto the base substrate; and a base angle of the trapezoid close to the base substrate is in a range from 30° to 60°.

5. The organic light-emitting display substrate of claim 1, wherein an orthographic projection of each first electrode pattern onto the base substrate, overlaps an orthographic projection of at most two first isolation structures onto the base substrate.

6. The organic light-emitting display substrate of claim 1, wherein the reflective metal pattern extends along the second direction; and each reflective metal pattern is between two adjacent first isolation structures.

7. The organic light-emitting display substrate of claim 1, further comprising second isolation structures; wherein each of the second isolation structures is between two adjacent first isolation structures, and is connected to the two adjacent first isolation structures; and each of the second isolation structures extends along the first direction.

8. The organic light-emitting display substrate of claim 7, wherein the first isolation structures and the second isolation structures divide the organic light-emitting display substrate into the plurality of light-emitting areas serving as a plurality of display sub-regions; there is a plurality of first electrode patterns in each of the plurality of display sub-regions; and the plurality of first electrode patterns in a same display sub-area are corresponding to sub-pixels of a same color.

9. The organic light-emitting display substrate of claim 1, further comprising third isolation structures; wherein each of the third isolation structures extends along the first direction; and each of the third isolation structures is in contact with edges of multiple first isolation structures in the second direction.

10. The organic light-emitting display substrate according to claim 1, wherein the organic light-emitting display substrate further includes an organic planarization layer and an inorganic protection layer sequentially arranged in a direction away from the base substrate; the organic planarization layer and the inorganic protection layer are between the driving circuit layer and the reflective metal layer; and a range of an orthographic projection of the reflective metal layer onto the base substrate is within a range of the inorganic protection layer.

11. The organic light-emitting display substrate of claim 10, wherein the inorganic protection layer includes a plurality of inorganic protection layer-patterns separated from each other; an orthographic projection of each of the plurality of inorganic protection layer-patterns onto the base substrate is between orthographic projections of two adjacent first isolation structures onto the base substrate.

12. The organic light-emitting display substrate of claim 10, wherein the reflective metal layer is made of silver; the inorganic protection layer is made of indium tin oxide; and the reflective metal layer is in direct contact with the inorganic protection layer.

13. A display device, comprising an organic light-emitting display substrate,
 wherein the organic light-emitting display substrate includes:
 a base substrate;
 a driving circuit layer on the base substrate; and,
 a plurality of light-emitting devices on one side of the driving circuit layer away from the base substrate;
 wherein each of the plurality of the light-emitting devices includes a first electrode layer; the first electrode layer includes a plurality of first electrode patterns separated from each other; the organic light-emitting display substrate further includes a reflective metal layer; the reflective metal layer is between the driving circuit layer and the first electrode layer; the reflective metal layer is insulated from the first electrode layer; the reflective metal layer includes a plurality of reflective metal patterns separated from each other; and an orthographic projection of each reflective metal pattern onto the base substrate overlaps an orthographic projection of at least two first electrode patterns onto the base substrate;
 wherein the organic light-emitting display substrate further includes a plurality of first isolation structures; the plurality of first isolation structures are on one side of the first electrode layer away from the base substrate; the plurality of first isolation structures are sequentially arranged in parallel along a first direction; each of the plurality of first isolation structures extends in a second direction; in the first direction, each of the plurality of first isolation structures is between two adjacent light-emitting areas of a plurality of light-emitting areas; the first direction and the second direction are different directions, and each light-emitting area includes some of the plurality of light-emitting devices;
 wherein the first electrode pattern is electrically connected to the driving circuit layer through a via-hole; and an orthographic projection of the via-hole onto the base substrate overlaps an orthographic projection of the first isolation structure onto the base substrate;
 wherein in the first direction, each light-emitting area is between two adjacent first isolation structures, the two adjacent first isolation structures are respectively located on a first side of the light-emitting area and a second side of the light-emitting area, the first side and the second side of the light-emitting area are opposite sides in the first direction;
 wherein in each light-emitting area, along the second direction, an orthographic projection of a via-hole corresponding to one of two adjacent first electrode patterns overlaps the orthographic projection of a first isolation structure on the first side of the light-emitting area onto the base substrate and does not overlap the orthographic projection of a first isolation structure on the second side of the light-emitting area onto the base substrate, and an orthographic projection of a via-hole corresponding to the other of the two adjacent first electrode patterns overlaps an orthographic projection of a first isolation structure on the second side of the light-emitting area onto the base substrate and does not overlap the orthographic projection of a first isolation structure on the first side of the light-emitting area onto the base substrate.

14. The display device of claim 13, further comprising second isolation structures; wherein each of the second isolation structures is between two adjacent first isolation structures, and is connected to the two adjacent first isolation structures; and each of the second isolation structures extends along the first direction.

15. The display device of claim 14, wherein the first isolation structures and the second isolation structures divide the organic light-emitting display substrate into the plurality of light-emitting areas serving as a plurality of display sub-regions; there is a plurality of first electrode patterns in each of the plurality of display sub-regions; and the plurality of first electrode patterns in a same display sub-area are corresponding to sub-pixels of a same color.

16. The display device of claim 13, further comprising third isolation structures; wherein each of the third isolation structures extends along the first direction; and each of the third isolation structures is in contact with edges of multiple first isolation structures in the second direction.

* * * * *